Oct. 18, 1966 R. EMEIS 3,280,384

ENCAPSULED SEMICONDUCTOR DEVICE WITH LAPPED SURFACE CONNECTOR

Filed July 11, 1962

3,280,384

ENCAPSULED SEMICONDUCTOR DEVICE WITH LAPPED SURFACE CONNECTOR

Reimer Emeis, Ebermannstadt, Upper Franconia, Germany, assignor to Siemens-Schuckertwerke Aktiengesellschaft, Berlin-Siemensstadt, Germany, a corporation of Germany Filed July 11, 1962, Ser. No. 209,047
Claims priority, application Germany, July 12, 1961, S 74,774
10 Claims. (Cl. 317—234)

My invention relates to encapsuled electronic semiconductor devices such as rectifier diodes, power rectifiers, transistors and other devices of the junction type.

In a more particular aspect my invention relates to semiconductor devices which have a monocrystalline semi-conductor plate joined in large-area connection with a carrier plate of a material having good electric heat conductance and a thermal coefficient of expansion departing only slightly from that of the semiconductor material. For semiconductor plates of germanium or silicon, the carrier plate may consist of molybdenum or tungsten, for example.

Difficulties arise when such a carrier plate is joined with a heat-sink structure which cools the semiconductor device during operation. Such a heat-sink structure may constitute, for example, a copper block with cooling vanes, a heat dissipating device which comprises a cooling-water circulation, or other heat-sink equipment. The carrier plate must be joined with such a heat-sink structure across a relatively large area in order to secure good heat transfer and only slight electric resistance at the junction. When employing soft solder such as tin or lead solder, it may happen that the occurrence of relatively high electric loads and correspondingly intensive heat generation will cause the temperature to exceed, at least locally, the melting point of the solder so that de-soldering can occur. When using hard solder, such as silver, the required high soldering temperature is apt to impair the electric properties of the semiconductor member, for example, a transistor, rectifier or photoelement, previously firmly joined with the carrier plate. The use of pressure, soldering aids and other auxiliaries in such cases is permissible only to a limited extent because mechanical stresses or impurities may cause disturbances and faults.

Another known method of joining the carrier plate of a semiconductor member with a heat sink is by means of cold plastic deformation. This method relates to the encapsulating of an electric semiconductor member, which is connected with a plate of good heat conducting material serving as an electric current lead, into a housing consisting of a base plate of good heat conducting material and a cup-shaped cover portion. According to this method, the connecting plate joined with the semiconductor member is inserted partially into a recess of a considerably thicker base plate and is then firmly fastened to the base plate by plastically deforming the material of the base plate in cold condition. Thereafter the cup-shaped housing portion is fastened to the base plate by applying another plastic deformation of the base-plate material in cold condition. In this known method which is set forth in German published patent application DAS 1,098,103, the above-mentioned plate, serving as an electric supply conductor, consists of silver and is coated with gold. The base plate may consist of soft copper which is readily deformable and affords the desired good thermal conductance.

This known method, however, is not applicable for semiconductor members whose carrier plate material has a thermal coefficient of expansion that does not appreciably depart from that of the semiconductor material. This is because thermal alternating stresses occur during operation of semiconductor devices, and considerable differences in thermal expansion and contraction of the carrier plate on the one hand and the base or heat-sink plate of good thermally conducting material on the other hand damage or destroy the necessary intimate area bonding between the carrier plate and the base plate.

It is an object of my invention to minimize or avoid almost entirely the disadvantages of the known methods.

Another more specific object of my invention is to do away with all soldering and fusing operations in the fabrication steps necessary for encapsulating a semiconductor member and joining it with a base or heat-sink structure, while also eliminating the danger of loosening the connection due to differences in thermal coefficients of expansion.

Still another object of my invention is to simplify the production and assembly work of diode groups to form three-phase or other multi-phase rectifier bridge networks.

My invention is predicated upon an encapsulated semiconductor device which comprises a plate-shaped, essentially monocrystalline semiconductor member having at least one metallic carrier plate area-bonded with the semiconductor member and consisting of molybdenum or other metallic material having a thermal coefficient of expansion not appreciably different from that of the silicon, germanium or other substance of the semiconductor plate. The housing of the semiconductor device comprises a heat-sink or cooling body which serves for dissipating or distributing the operational heat from the semiconductor member and which is to be in intimate broad-area connection with the carrier plate or another surface of the semiconductor member. Relating to such an encapsulated semiconductor device, it is an essential feature of my invention that the semiconductor member, comprising the integral carrier plate, preferably a molybdenum plate alloyed together with the semiconductor plate, is secured between the heat-sink body of the housing and a second metallic body at an area pressure between about 100 and about 500 kg./cm.$^2$ by means of spring pressure, the heat-sink body and the second metal body constituting current supply means for passing electric current through the semiconductor member during its operation.

It will be understood, therefore, that after the semiconductor member of such a device is produced, this member comprising the crystalline semiconductor body with the integral or alloyed electrodes and the integral or alloyed carrier plate, no soldering, welding or other diffusing operations are involved for encapsulating the semiconductor member and fully enclosing it in the housing to produce and finish an operational device.

The invention will be further explained with reference to an embodiment of an electronic semiconductor device according to the invention illustrated by way of example in the accompanying drawing, in which.

Figure 1:
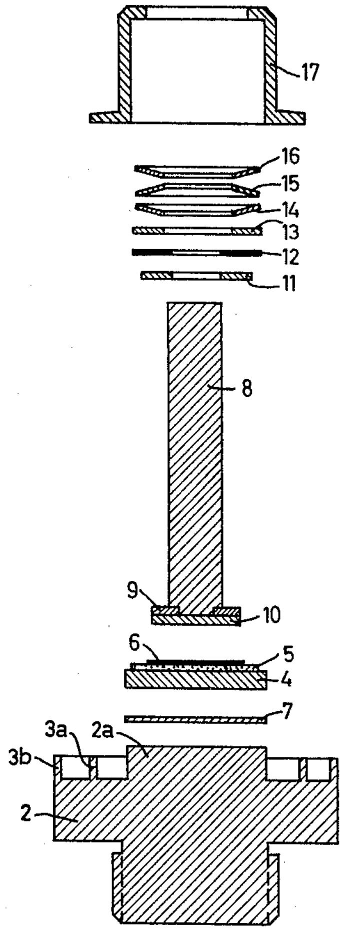
FIG. 1 is a sectional side view of the individual parts of the semiconductor device in axial section and in exploded form, prior to mounting these parts together.
Figure 2:
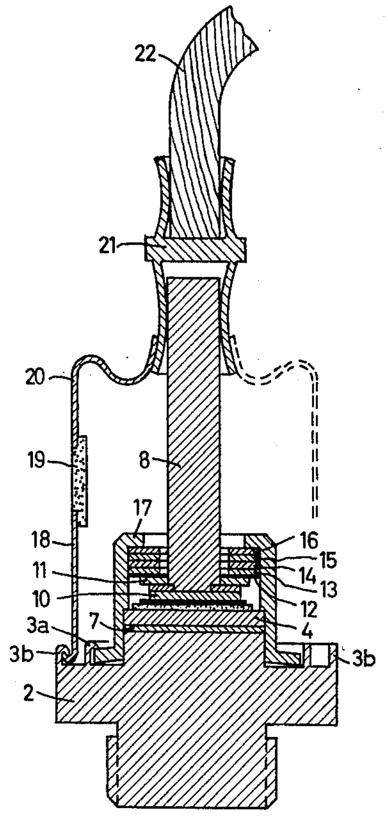
FIG. 2 is a sectional side view in axial section of the completed device when fully assembled.

The cooling body of the semiconductor device, according to FIGS. 1 and 2, consists of a massive copper block 2 with an upward projection 2*a* upon which the carrier plate 4 of the semiconductor member is fastened. A ring-shaped ridge 3*a* serves for fastening a holder structure 17 to the copper block 2. The outer, upwardly extended rim portion 3*b* of the copper block 2 serves for fastening the upper, cup-shaped portion 18, 19, 20, 21 of the housing to said copper block. The semiconductor member, comprising the carrier plate 4 and the semiconductor member 5 proper, constitutes a sub-assembly which is produced prior to mounting it into the housing, by means of a single alloying operation. In the illustrated embodiment, the semiconductor member is shown to consist of the carrier plate 4, a semiconductor plate 5 with an electrode 6, the electrode being produced by alloying and the carrier plate 4 being joined with the semiconductor plate 5 by alloying. The production of the sub-assembly may proceed as follows.

Placed upon a molybdenum disc of about 22 mm. diameter is an aluminum disc of about 19 mm. diameter. Coaxially placed upon the aluminum disc is a monocrystalline circular plate of p-type silicon having a specific resistance of about 1000 ohm cm., the diameter of the plate being about 18 mm. Thereafter, a gold foil is placed upon the silicon plate. The gold foil material contains about 0.5% antimony, the remainder being gold. The gold foil has a somewhat smaller diameter, for example 14 mm., than the silicon disc. The entire assembly is embedded in a powder that does not react with the above-mentioned materials and does not melt at the processing temperature. The embedding powder preferably comprises graphite. The embedded assembly is kept under pressure and heated at about 800° C. The heating may be accomplished in an alloying furnace which is evacuated or filled with protective gas. The result is the semiconductor member comprising the carrier plate 4 of molybdenum, the semiconductor plate 5 bonded with the carrier plate by an aluminum alloy, and the electrode 6 which is alloyed into the opposite surface of the semiconductor plate.

The sub-assembly so made can be etched in known manner. Etching is preferably applied to the portion of the semiconductor surface at which the p-n junction between the electrode 6 and the semiconductor material emerges at the surface. Thereafter it is preferable to provide the semiconductor surface with an oxide coating, for example by anodic treatment or the like.

Details of the processing described in the foregoing paragraph appear in my copending patent application Serial No. 208,988, now Patent No. 3,233,309, filed concurrently herewith, assigned to the same assignee as this application, and claiming a priority based upon the German application S74,813 VIIIc/21g, filed July 14, 1961. See also my Patent No. 2,960,419.

Thus prepared, the carrier plate of the semiconductor member is placed upon the projection 2*a* of the cooling body 2. It is preferable to insert a relatively thick layer 7 of silver, for example a foil of 100 to 200 micron thickness, between the projection 2*a* of the copper block 2 and the carrier plate 4. Giving the silver layer a thickness of more than 50 microns reliably prevents penetration of the copper through the silver layer due to the heat occurring during operation of the device.

Tests have shown that it is not necessary to fasten the silver layer 7 on the copper block by soldering or other fusion methods. It rather suffices to simply place the silver foil between the projection of the copper block and the carrier plate 4. The passage of electric current and heat are so slightly impeded by such a silver layer that the effect remains negligible.

The silver layer 7 may consist for example of a silver foil which is provided on both sides with a relief pattern, such as a waffle embossment similar to the knurling on knurled knobs of manually operable bolts.

According to a preferred mode of proceeding, such a silver foil is annealed and subsequently etched, for example with the aid of nitric acid. This produces a fine etching pattern on the surface. It is further of advantage to lap the topside of the projection 2*a* as well as the bottom side of the molybdenum plate 4 to accurate planer shape, whereby a good transfer of heat and current between these components and the silver foil is reliably secured. Another way of attaining similar results is to use the silver layer 7 in the form of a net or meshwork of fine silver wires, for example a silver wire having a wire diameter of 0.05 to 0.3 mm. diameter.

The topside of the semiconductor member, namely the electrode 6 in the illustrated embodiment, which consists of a gold-silver eutectic, is likewise lapped to planar shape. Thereafter a plunger-like part can be placed upon this top surface. The plunger-shaped part is preferably assembled before mounting the individual components together. The plunger sub-assembly comprises a copper pin 8, a circular ring disc 9 likewise consisting of copper and a circular disc 10 of molybdenum. These parts are preferably joined together by hard soldering. The bottom side of the molybdenum disc 10 is preferably coated with silver, for example by plating, and is thereafter lapped to planar shape.

Coaxially surrounding or seated on the plunger-shaped sub-assembly and resting upon its base 9, 10 are the following components, in the sequence given. A washer 11 of steel, a ring-disc 12 of mica, another washer 13 of steel and three annular spring discs 14, 15 and 16 of steel which normally have somewhat arcuate shape and can be axially compressed to planar shape for the purpose of then exerting spring pressure in the axial direction. Subsequently, a holder structure 17 in form of a bell or cup is placed over the plunger-like part 8. With the aid of the holder the springs 14, 15, 16 are axially pressed together, and the holder cup is then fastened at its flange-like rim to the copper block 2 by bending the ridge 3*a* inwardly as shown in FIG. 2.

As is apparent from FIG. 2, the resulting device is extremely compact and has all of its individual parts accurately held fast in the correct position so that they cannot become displaced either by mechanical shock or by thermal displacement. The annular mica disc 12 serves for electrically insulating the cup-shaped holder 17 from the top surface of the semiconductor member and also for centering the plunger-like part 8 within the holder 17 and thereby relative to the semiconductor member. The outer edge of the mica disc 12 abuts against the inner wall of the holder 17, whereas the inner edge of the mica disc touches the copper pin 8, thus securing it in accurately centered position.

The device is completed by placing the bell or cup-shaped top portion of the housing over the entire arrangement of parts. The upper housing portion is composed of individual parts 18, 19, 20 and 21. The lower edge of the upper housing portion 18 has the shape of a flange which is fastened to the copper block 2 by bending the rim portion 3*b* of the block 2 inwardly over the flange of part 18. The copper pin 8 is joined with the part 21 of the housing portion by squeezing. Part 21 may consist of copper, whereas parts 18 and 20 may be made of steel or an iron-nickel-cobalt alloy such as available in commerce under the trade names Kovar or Vacon. The part 19 serves for insulation and consists preferably of ceramic material. At those localities where the insulating, ring-shaped part 19 is joined with the metal parts 18 and 20, the part 19 is preferably metalized so that it can be joined with parts 18 and 20 by soldering. A cable 22 is pushed from the outside into the connecting part 21 of the upper housing portion and is likewise joined therewith by a squeeze connection.

It will be understood that the semiconductor member, here shown to consist of a semiconductor plate with an alloyed electrode and an alloy-bonded carrier plate, may also have a design other than that illustrated and described herein. For example the semiconductor material may consist of germanium with alloyed electrodes of indium or lead-arsenic, for example. The carrier plate may consist of certain highly alloyed types of steel, for example, having a thermal coefficient of expansion similar to that of germanium or silicon. A significant property of the device according to the invention resides in the fact that the semiconductor member with its electrode means may also be inserted in a reverse position as compared with the one described above with reference to the accompanying drawing. That is, the carrier plate 4 may face the second metal body 10 in the fully assembled encapsuled condition. Consequently, the invention readily affords producing semiconductor diodes of respectively different polarity but having exactly the same external design and also the same internal design with the exception of the just-mentioned reversal. This can be used to advantage for example in the preparation of rectifier bridge circuits with the result that all rectifier diodes appertaining to the same rectifier pole of the load circuit can be fastened to one and the same cooling device or heat-sink structure, for example they can all be mounted on a common copper bar provided with a coolant circulation. Thus, for example, three diodes or groups of diodes appertaining to a three-phase bridge rectifier network can be fastened with their respective cooling bodies on one and the same heat sink. This results in a particularly simple and space-saving design of rectifying equipment. The wiring problems concerning the connections on the other side of the encapsuled semiconductor diodes are simplified accordingly.

It will be understood that, by providing a different design of the semiconductor assembly encapsulated in a housing, it has already been possible heretofore to build rectifier equipment of the type just mentioned; but heretofore it has been necessary to produce, during the manufacture thereof, two greatly different semiconductor diodes. The invention however affords for the first time providing the same advantages without essential change in the manufacture and manufacturing steps required for differentiation between the required diodes of different poling. In other words, although the ultimate result has also been attained, the invention permits achieving it in a greatly simplified and more advantageous manner.

Figure 3:
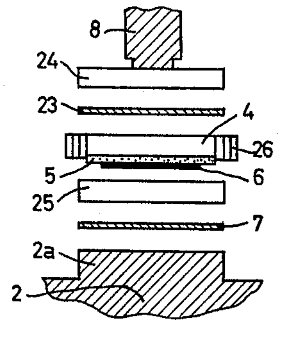
FIG. 3 is a sectional view of a modification of the embodiment of FIG. 2.

When assembling a rectifier device as described in the foregoing but with a reverse positioning of the semiconductor member within the housing, it is of course necessary to make certain that the device remains capable of providing the desired efficiency and stability at high loads and also at alternating loads. For this purpose (see FIG. 3), it is preferable to place upon the projection 2a of the cooling block 2 the silver foil 7 of the same diameter and to then place on top of the silver foil a disc 25 of molybdenum or equivalent substance also having the same diameter. The silver foil may be similar to the one shown at 7 in FIG. 2. The molybdenum disc 25 can be given a thickness of 1 to 2 mm. and should be lapped to planar shape on both sides. The electrode 6 which forms part of the semiconductor member 5 and which, in the above-described example, consists essentially of a gold-silicon eutectic, is preferably also lapped to planar shape on the top side, and the lapped surface is then placed upon the molybdenum disc 25. In other words, when using the semiconductor member 4, 5, 6 in a position reversed from that shown in FIG. 1 so that the carrier plate 4 is on top, a molybdenum plate 25 is inserted between the electrode 6, now facing downwardly, and the silver foil 7, the second molybdenum plate having the same diameter as the silver foil 7 and the projection 2a.

In general, the eutectic electrode or an alloyed electrode produced in any other manner, protrudes from the adjacent semiconductor material so that a contacting of the semiconductor material by the molybdenum disc is reliably prevented. Furthermore, in most cases the semiconductor material is additionally eliminated at the surface by etching so that it is somewhat farther remote from the plane of the lapped top surface of the alloyed electrode. A breakdown of the slight air layer between this semiconductor material and the opposite molybdenum disc can be further prevented by coating the semiconductor surface with an insulating varnish, for example a silicone varnish having an addition of alizarin.

The carrier plate 4 of the semiconductor member 5, which in the modified embodiment last discussed faces the plunger-like metal part 8, is preferably lapped, and a silver foil 23 is placed upon the lapped carrier plate. Thereafter a second metal body 24, which is secured to the plunger 8 in place of the moybdenum disc 10, is placed upon the silver foil. The second metal body differs from the disc 10 only in that it may consist of copper, although a molybdenum body is contemplated by the invention.

Since it is necessary to prevent the molybdenum plate from contacting the holder 17, which compresses all components with the required area pressure, the carrier plate 4 preferably has a somewhat smaller diameter than the molybdenum disc 25 placed upon the projection 2a of the cooling body. A ring of insulating material 26, for example mica, placed around the carrier plate is located between the holder 14 and the carrier plate after the holder is assembled with the cooling body and then provides for properly centering the components.

The above-described semiconductor member 4, 5, 6 may also be given a completely symmetrical design in mechanical respects with opposite molybdenum faces. Such a mechanically symmetrical member is described for example in my copending application Serial No. 208,988. Then the polarity of the completed, encapsulated device depends only upon the particular orientation of the semiconductor member chosen when the member is inserted into the housing. This affords dispensing, when desired, with the members 10 and 25.

To those skilled in the art it will be obvious from a study of this disclosure that with respect to design details, particular shapes and materials, my invention is amenable to a variety of modifications and can be given embodiments other than particularly illustrated and described herein, without departing from the essential features of my invention and within the scope of the claims annexed hereto.

I claim:

1. An encapsuled electronic semiconductor device, comprising a semiconductor member having an essentially monocrystalline semiconductor plate with integral electrode means and a metallic carrier plate area-bonded in face-to-face relation to said plate, said semiconductor member having two spaced opposite lapped surfaces, a housing having a cooling body of heat-conducting metal having a lapped surface in face-to-face heat-conductive relation to said member for dissipating heat therefrom, a second metallic body having a lapped surface, said semiconductor member being disposed between said cooling body and said second body with the lapped surface of said cooling body in face-to-face contact with one of the lapped surfaces of said semiconductor member and with the lapped surface of said second metallic body in face-to-face contact with the other of the lapped surfaces of said semiconductor member, spring-pressure means holding said member between said two bodies at a spring pressure of 100 to 500 kg./cm.$^2$, said two bodies constituting current supply means for said semiconductor member and said spring pressure means being independent of said current supply means.

2. An encapsuled electronic semiconductor device, comprising a semiconductor member having an essentially monocrystalline semiconductor plate with integral electrode means and a metallic carrier plate area-bonded in face-to-face relation to said plate, said semiconductor member having two spaced opposite lapped surfaces, a housing having a cooling body of heat-conducting metal having a lapped surface in face-to-face heat-conductive relation to said member for dissipating heat therefrom, a second metallic body having a lapped surface, said semiconductor member being disposed between said cooling body and said second body with the lapped surface of said cooling body in face-to-face contact with one of the lapped surfaces of said semiconductor member and with the lapped surface of said second metallic body in face-to-face contact with the other of the lapped surfaces of said semiconductor member, a holder structure rigidly fastened to said cooling body and comprising spring means having between said member and said respective two bodies an area force between 100 and 500 kg./cm.$^2$, said two bodies constituting current supply means for said semiconductor member and said spring means being independent of said current supply means.

3. In a semiconductor device according to claim 2, said semiconductor member and said two bodies having circular shape and being coaxially arranged relative to each other, said holder structure comprising a rigid cup member having a rim portion coaxially fastened to said cooling body and having a central opening in its bottom, said semiconductor member and second body being mounted in said cup member, and said spring means being mounted adjacent to the bottom of said cup member, and conductor means extending through said opening to said semiconductor member.

4. In a semiconductor device according to claim 3, said spring means comprising annular spring discs individually surrounding said conductor means.

5. An encapsulated electronic semiconductor device, comprising a semiconductor member having an essentially monocrystalline semiconductor plate with integral electrode means and a metallic carrier plate area-bonded in face-to-face relation to said plate, said semiconductor member having two spaced opposite lapped surfaces, a housing having a cooling body of copper with a lapped planar surface, a layer of silver on said surface, a second metallic body having a lapped surface, said semiconductor member being disposed between said silver layer and the lapped surface of said second body in face-to-face area contact with both, and spring means holding said semiconductor member in said contact only by spring pressure between said two bodies, said two bodies comprising current supply means for said semiconductor member and said spring means being independent of said current supply means.

6. In a semiconductor device according to claim 1, said carrier plate facing said cooling body, and said semiconductor member facing said second body.

7. In a semiconductor device according to claim 1, said carrier plate facing said second body, and said semiconductor member facing said cooling body.

8. In a semiconductor plate according to claim 1, said carrier plate and said second body consisting of metal selected from the group consisting of tungsten and molybednum.

9. In a semiconductor plate according to claim 1, said second body consisting of molybdenum.

10. An encapsulated electronic semiconductor device, comprising a semiconductor member having an essentially monocrystalline semiconductor plate with integral electrode means and a metallic carrier plate area-bonded in face-to-face relation to said plate, said semiconductor member having two spaced opposite lapped surfaces, a housing having a cooling body of copper with a lapped planar surface, a layer of silver on said surface, a second body of plate shape consisting of molybdenum having a lapped surface, said semiconductor member being disposed between said silver layer and the lapped surface to said second body in face-to-face area contact with both, and spring means holding said semiconductor member in said contact only by spring pressure which has between said two bodies a magnitude between 100 and 500 kg./cm.$^2$, said two bodies comprising current supply means for said semiconductor member and said spring means being independent of said current supply means.

References Cited by the Examiner

UNITED STATES PATENTS

| | | | |
|---|---|---|---|
| 2,863,105 | 12/1958 | Ross | 317—235 |
| 2,896,128 | 7/1959 | Fuller et al. | 317—234 |
| 2,933,662 | 4/1960 | Boyer et al. | 317—234 |
| 3,059,157 | 10/1962 | English et al. | 317—234 |

JOHN W. HUCKERT, *Primary Examiner.*

GEORGE N. WESTBY, L. ZALMAN, J. D. KALLAM, *Assistant Examiners.*